(12) United States Patent
Nishida

(10) Patent No.: US 9,109,282 B2
(45) Date of Patent: Aug. 18, 2015

(54) METHOD OF DEPOSITION

(75) Inventor: Shoso Nishida, Hiroshima (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 195 days.

(21) Appl. No.: 13/609,913

(22) Filed: Sep. 11, 2012

(65) Prior Publication Data

US 2013/0062194 A1    Mar. 14, 2013

(30) Foreign Application Priority Data

Sep. 12, 2011 (JP) .................................. 2011-198043

(51) Int. Cl.
  C23C 14/34 (2006.01)
  C23C 14/50 (2006.01)
  H01J 37/20 (2006.01)

(52) U.S. Cl.
  CPC .............. *C23C 14/34* (2013.01); *C23C 14/50* (2013.01); *H01J 37/20* (2013.01); *H01J 2237/2007* (2013.01)

(58) Field of Classification Search
  CPC ......... C23C 14/34; C23C 14/50; H01J 37/20; H01J 2237/2007
  USPC .............. 204/192.12, 192.15; 427/248.1, 289
  See application file for complete search history.

(56) References Cited

U.S. PATENT DOCUMENTS

| 2,635,289 A * | 4/1953 | Owens .......................... 156/221 |
| 2007/0020903 A1 | 1/2007 | Takehara et al. |
| 2008/0113100 A1 | 5/2008 | Umezawa |
| 2009/0134543 A1 | 5/2009 | Umezawa et al. |

FOREIGN PATENT DOCUMENTS

| CN | 1900359 A | 1/2007 |
| CN | 101102876 A | 1/2008 |
| CN | 101263242 A | 9/2008 |
| JP | 60-78415 U | 5/1985 |
| JP | 1180927 A | 3/1999 |
| JP | 2004-338328 A | 12/2004 |
| JP | 2008221575 A | 9/2008 |
| JP | 2009-23189 A | 2/2009 |
| JP | 2009-274406 A | 11/2009 |
| JP | 2010-89448 A | 4/2010 |

OTHER PUBLICATIONS

Machine Translation of JP 2009-023189 dated Feb. 5, 2009.*
Machine Translation of JP 2009-274406 dated Nov. 2009.*

(Continued)

*Primary Examiner* — Rodney McDonald
(74) *Attorney, Agent, or Firm* — Sughrue Mion, PLLC

(57) ABSTRACT

A method of deposition is provided in which a deposition operation can be immediately performed when a workpiece for deposition is carried into a deposition chamber irrespective of a shape or a structure of the workpiece for deposition. The workpiece for deposition is integrally molded with an assisting member, which is configured to maintain the workpiece for deposition in a predetermined orientation such that a deposition surface or a deposition portion thereof faces a target material when the workpiece for deposition is carried into a deposition chamber and is placed on a deposition stand, when the workpiece for deposition is injection-molded; and the workpiece for deposition is carried into the deposition chamber and is deposited.

10 Claims, 2 Drawing Sheets

(56) References Cited

OTHER PUBLICATIONS

Office Action, dated Mar. 4, 2014, issued by the Japanese Patent Office in counterpart Japanese Patent Application No. 2011-198043.

Office Action dated Jan. 5, 2015 issued by the State Intellectual Property Office of P.R. China in counterpart Chinese Patent Application No. 201210337176.7.

* cited by examiner

METHOD OF DEPOSITION

This application claims priority from Japanese Patent Application No. 2011-198043 filed on Sep. 12, 2011, the entire subject-matter of which is incorporated herein by reference.

BACKGROUND OF THE INVENTION

1. Field of the Invention

The present invention relates to a method of deposition in which a workpiece for deposition such as a substrate made of resin is carried into a vacuum chamber or a deposition chamber and then a thin film is formed on a predetermined surface of the workpiece.

2. Description of the Related Art

Some deposition workpieces have a film thickness of the order of several μm. An automobile headlamp is one example of such a deposition workpiece. The headlamp is made by a deposition device or a vapor deposition device. The deposition device may be applied to manufacturing of a magnetic disk, manufacturing of a metallic film of a recording surface of a CD/DVD, manufacturing of a transparent electrode of a liquid crystal display or manufacturing of a photocatalytic film. When making the above-described product having a thin film, a substrate is formed by injection molding, masking or the like is performed of unnecessary portions of the substrate, and the substrate is then set in an exclusive deposition chamber. Next, the thin film is formed by a deposition element as described below. In addition, the same kind of deposition device is also used to deposit a protective film, which protects an organic emission layer on a substrate.

The above-described method of evaporation or the method of deposition forming a thin film on a surface of a substrate is known in the related art. For example, there have been known a sputtering method in which a surface of a substrate, which is a workpiece for the deposition, and a target material are placed facing each other, a negative voltage of several kV is applied to the target material in an argon gas atmosphere of several Pa to several tens of Pa, and thereby the thin film is formed by discharging. There have also been known an electron beam deposition method in which an electron beam, which is generated from an electron gun in a vacuum chamber, is emitted to a target material, which is heated and evaporated and thereby deposited on the surface of the workpiece. Further, there have been known an ion plating method in which a negative voltage of several kV is applied to a substrate and the vacuum evaporation is performed on the substrate under argon gas at a pressure of several Pa. Still further, a plasma deposition method and the like have been known in the related art. In addition, a method of chemical evaporation has also been known. As the target material used in the above-described deposition methods, compound targets such as oxide, nitride, carbide and the like have been known. Further, a metallic target, a powder target and the like have also been known.

JP-A-2008-221575 discloses a deposition device, in which an inner surface of a semi-hollow body of a pair of semi-hollow bodies, in other words, a surface of a workpiece for deposition, which is molded by a fixed mold and a movable mold, is covered in a deposition chamber, where a target electrode, a substrate electrode and a deposition element such as a vacuum suction tube or the like are provided, in a state where the workpiece is left in the fixed mold, and thereby deposition on the surface of the workpiece is performed in the fixed mold. JP-A-11-80927 discloses a deposition device, in which a main portion of a deposition chamber is covered by a earth shield material which also serves a mask.

According to the deposition device disclosed in JP-A-2008-221575, the deposition can be performed in the metallic mold using a deposition chamber without the workpiece being removed from the metallic mold. Therefore, the deposition surface is not contaminated with dirt from hands, dust or the like, so that a product having a high quality thin film of a favorable deposition state can be obtained. In addition, deposition is performed with the workpiece remaining in the metallic mold, so that inventory control of the semi-hollow bodies is not necessary. Furthermore, automatic molding can be performed with low price only by preparing the deposition device without using a specific mold.

However, the inventor has found points that are necessary to be improved. For example, a time when the workpiece is molded in the mold and a time when the deposition chamber is used and the deposition is performed, are not concurrent, so that waiting time occurs in order to match these timings, and efficient production may not be achieved. In addition, since an opening of the deposition chamber is in close contact with a parting surface of the mold, and a vacuum chamber is formed inside thereof, there is also a problem of sealing. In other words, since vacuum degree has influence on the quality of the product, a high sealing property is required. However, since an opening of the deposition chamber and a parting surface of the mold have different members from each other according to their purpose and have different configurations, sealing becomes a problem. Furthermore, in order for insertion and removal from the large deposition chamber between the molds which covers the concave portion of the mold, an amount of a mold opening of the molds becomes large, and a robot for inserting and removing the deposition chamber to and from the molds also becomes large.

For the above-described reasons, it is preferable that the workpiece for deposition, which is molded by the mold, is removed from the mold and is carried into the exclusive deposition device, and then the deposition is performed on the workpiece. Such a method is preferable when the workpiece is a planar shape and a portion to be deposited is a planar surface, because the portion to be deposited onto can face a target material only by carrying the workpiece into the deposition chamber and placing the workpiece in the deposition chamber. The above-described method of depositing the planar surface is disclosed in JP-A-11-80927.

However, a target material is sputtered by high energy particles such as plasma particles, and becomes target particles which have a tendency to fly straight. Accordingly, target particles are difficult to be attached to the deposition surface which does not face the target material. In other words, the target particles are difficult to be attached to a concave portion and a convex portion which are concealed with respect to the target material. When the deposition surface is configured of a plurality of different surfaces, the target particles may not be evenly attached. Thus, it is necessary that the deposition surface be held exactly by a jig or the like in order to carry the workpiece into the deposition chamber and portions which become concealed, decrease, or the deposition surfaces of different directions are facing the target material as much as possible. Thus, there are problems that time is further required to the deposition operation and the cost thereof increases.

SUMMARY OF THE INVENTION

Under the foregoing circumstances, an object of the invention is to provide a method of deposition in which a deposition operation can be immediately performed when a workpiece for deposition is carried into a deposition chamber irrespective of a shape or a structure of the workpiece for deposition.

According to the invention, generally, the workpiece for deposition is molded by an injection molding. As known in the related art, in injection molding, a fixed mold and a movable mold are applied, and an entering piece or the like may be used when necessary. In addition, molding can be performed from different kinds of resins by a primary molding and a secondary molding. Accordingly, the workpiece can be automatically molded, even though the workpiece has a complicated shape. When the workpiece for deposition is molded as described above, an assisting member is integrally molded with the workpiece for deposition.

When the workpiece for deposition is carried into the deposition chamber and is placed on a deposition stand, the assisting member is configured to arrange the deposition surface or deposition portion of the workpiece for deposition to face the target material. In other words, the assisting member performs a displacement operation such as inclining the workpiece for deposition to a predetermined amount and floating the workpiece for deposition a predetermined amount, so as to hold the workpiece for deposition in position. According to the displacement and holding operation, the deposition surface or the deposition portion comes to face the target material. Here, "facing" does not mean that a plurality of deposition surfaces and the deposition portions are necessarily opposite the target material at a right angle. The direction of the target material means a direction in which a portion which becomes concealed is not present or a direction in which a portion which becomes concealed is small.

As described above, when the workpiece for deposition is carried into the deposition chamber, the deposition surface faces the target material so that the deposition element is immediately operated and the deposition is started. After deposition, the workpiece is removed from the deposition chamber. Further, when necessary, the assisting member is separated. In this case, since the assisting member is a portion which is cut off from the product and destroyed, the assisting member is molded to have a structure suitable to be cut.

That is, according to a first illustrative aspect of the invention, there is provided a method of deposition comprising: integrally molding a workpiece for deposition with an assisting member, which is configured to maintain the workpiece for deposition in a predetermined orientation such that a deposition surface or a deposition portion of the workpiece faces a target material when the workpiece for deposition is carried into a deposition chamber and is placed on a deposition stand, when the workpiece for deposition is molded by an injection molding; carrying the workpiece for deposition, to which the assisting member is molded, into the deposition chamber; and depositing the workpiece for deposition, to which the assisting member is molded.

According to a second illustrative aspect of the invention, the method further comprises: cutting off the assisting member from the workpiece for deposition after the depositing.

According to a third illustrative aspect of the present invention, the assisting member is directly molded with a back surface side of the workpiece for deposition or integrally molded with an auxiliary member of the workpiece for deposition.

According to a fourth illustrative aspect of the invention, the assisting member is integrally molded with the workpiece for deposition or the auxiliary member with having a portion where the cross section of the assisting member is narrow.

According to a fifth illustrative aspect of the invention, the assisting member is molded with the workpiece for deposition as a plurality of rod-shaped members.

According to a sixth illustrative aspect of the invention, the assisting member is molded to have a narrow cross section at the portion to be protruded outside a side portion of the workpiece for deposition.

According to a seventh illustrative aspect of the invention, a plurality of assisting members is integrally molded with the workpiece for deposition.

According to an eighth illustrative aspect of the invention, the plurality of assisting members is molded to have a narrow cross section at the portion to be protruded outside a side portion of the workpiece for deposition.

As described above, according to the invention, since the assisting members are integrally molded with the workpiece for deposition, when the workpiece for deposition is placed on the deposition stand in the deposition chamber, the deposition surfaces or the deposition portions face the target material. Thus, according to the invention, when the workpiece for deposition is carried into and is placed in the deposition chamber, the deposition operation can be immediately performed irrespective of the shape and the structure of the workpiece for deposition, so that the deposition time can be reduced. Generally, the deposition time for deposition of the workpiece is longer than the time for injection molding time. According to the invention, since such a long time can be reduced, a production cycle of the product having the thin film can be reduced. The assisting member may be cut off when interfering with the product. Here, according to another invention, the assisting member is integrally molded with the workpiece for deposition or an auxiliary member through a portion where a cross section thereof is narrowed, so that the assisting member can be easily cut off. Further, according to an invention where the assisting member is formed of a plurality of rod-shaped members, the molding material of the assisting member is small, so that the cutting off of the workpiece can be easily performed.

BRIEF DESCRIPTION OF THE DRAWINGS

FIGS. 1A to 1D are views illustrating an example of a workpiece which is deposited by an embodiment of the invention, in which FIG. 1A is a perspective view of the workpiece, FIG. 1B is a cross-sectional view taken along line a-a in FIG. 1A, FIG. 1C is a view illustrating the workpiece in an inclined state shown in FIG. 1B and a cross-sectional view to describe a relationship between a flying direction of target particles and a deposition surface, and FIG. 1D is a view illustrating an example in which the assisting member is integrally molded according to an embodiment of the invention and a cross-sectional view corresponding to FIG. 1C;

FIGS. 3A and 3B are views illustrating a main portion of the workpiece including the assisting member according to another embodiment of the invention, in which FIG. 3A is a cross-sectional view illustrating an example where there is one assisting member, and FIG. 3B is a cross-sectional view illustrating another embodiment corresponding to a view seen in an X-X direction in FIG. 1D.

DETAILED DESCRIPTION OF THE PREFERRED EMBODIMENTS

Figure 1A:
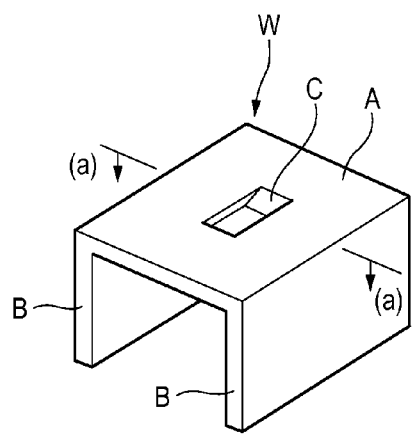
Figure 1B:
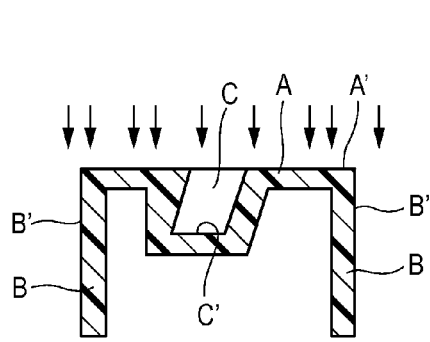

Hereinafter, an embodiment of the invention will be described with reference to the drawings. According to the embodiment, as shown in FIGS. 1A and 1B, a workpiece W for deposition is configured by a top portion A and both side portions B and B which are substantially at right angles with the top portion A. The workpiece for deposition generally has a shape in which groove-formed steel is cut. Thus, the workpiece W for deposition has a relatively deep concave portion C toward the back side of the top portion A. The concave portion C is inclined with respect to the planar top portion A. Accordingly, target particles, which are illustrated by a plurality of arrows in FIG. 1B, are difficult to reach deposition surfaces B' and B' of the both side portions B and B, and a deposition bottom surface C' of the concave portion C. The surfaces become deposition surfaces or deposition portions B', B' and C' where the target particles are difficult to reach. The embodiment according to the invention is to deposit these different deposition surfaces B' and B' and the deposition bottom surface C' at the same time.

The workpiece for deposition W described above can be molded by the mold which is known in the related art and thereby a specific example of the mold is not described. The top portion A and both side portions B and B are molded by the fixed mold and the movable mold which is opened and closed with respect to the fixed mold, and at the same time, the concave portion C is molded by the entering piece which is provided to be driven in an inclined direction with respect to the mold opening and closing direction at a parting surface side of the mold.

Figure 1C:
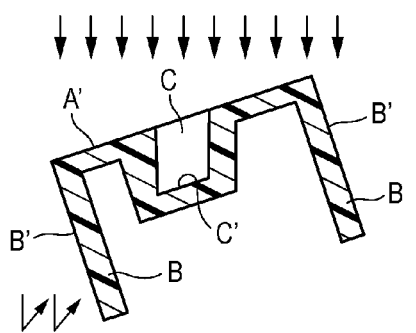
Figure 1D:
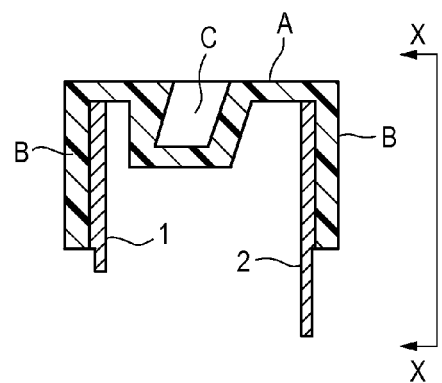

When the workpiece for deposition W is molded as described above, the assisting member is integrally molded with the workpiece for deposition W. According to the embodiment, as shown in FIG. 1C, when the workpiece for deposition W is inclined at a predetermined angle with respect to the horizontal surface, the target particles can also favorably reach the deposition surface A' of the top portion A, the both sides B' and B' of the deposition surfaces and the deposition bottom surface C' of the concave portion C. Accordingly, in the embodiment, as shown in FIG. 1D, a pair of long and short assisting members 1 and 2, which extend from the back surface side of the both side portions B and B to the outside in a predetermined direction, are integrally molded. As shown in FIG. 1C, the workpiece W is inclined and supported by the assisting members 1 and 2. According to the embodiment, the long and short assisting members 1 and 2 are molded as portions of the side portions B and B in the rear of the both side portions B and B.

Figure 2:
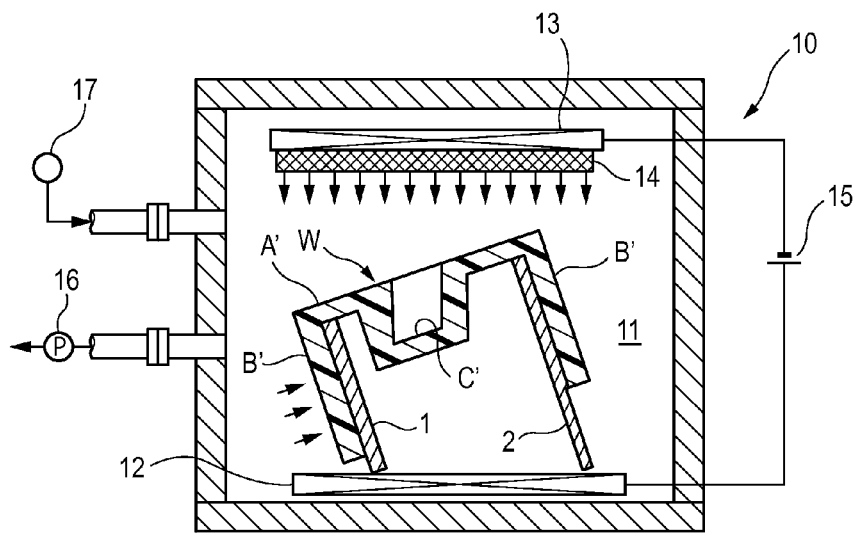
FIG. 2 is a cross-sectional view schematically illustrating an example of a deposition device used in the embodiment of the invention.

As described above, the deposition device is known in the related art as the sputtering deposition device, the electron beam vapor deposition device, the ion plating deposition device, or the like. In addition, the sputtering type deposition device is also known in the related art as a direct-current type, a high frequency type, a magnetron type, or the like. Thus, detailed description of the deposition device is omitted. The serial type sputtering deposition device 10 is schematically illustrated in FIG. 2. A planar deposition stand (e.g., a substrate electrode) 12 is provided on a lower portion of the deposition chamber 11. A target mounting stand (e.g., a target electrode) 13 is provided above the deposition stand 12 so as to face the deposition stand 12. A direct current power supply 15, which is connected to the deposition stand 12 and the target mounting stand 13 respectively, is arranged outside of the deposition chamber 11. A vacuum source 16 configured of a rotary pump or the like which is required for the vacuum deposition, an inert gas tank, an inert gas supply source 17 which produces inert gas such as carbon dioxide, or the like, are connected to the deposition chamber 11. In addition, an entrance of the workpiece for deposition W is provided at a front side of the deposition chamber 11 in order to easily operate. Incidentally, the entrance and a front door of the workpiece for deposition W are not shown in the drawings.

Next, an example of the deposition using the deposition device 10 of the embodiment is described. As described above, the workpiece for deposition W having the assisting members 1 and 2 is injection-molded. The movable mold is opened and the workpiece for deposition W is ejected. The workpiece for deposition W is carried into the deposition chamber 11 by using a multi-joint robot, for example, and is placed on the deposition stand 12. As shown in FIG. 2, when the workpiece for deposition W is placed, the workpiece for deposition W is supported by the pair of long and short assisting members 1 and 2 in an inclined state on the deposition stand 12. The deposition surfaces A', B', B' and C' face the target material 14.

The front door of the deposition chamber 11 is closed. The deposition element is immediately actuated. In other words, the vacuum source 16 and the inert gas supply source 17 are appropriately driven so as to form an inert gas atmosphere of several Pa to several tens of Pa in the deposition chamber 11. Thus, a negative voltage is applied to the target mounting stand 13, on which the target material 14 is pre-mounted, and a positive voltage is applied to the deposition stand 2, thereby discharging. Then, the target particles reach the deposition surface A' of the top portion A of the workpiece for deposition W, the deposition surfaces B' and B' of the both sides, and the deposition bottom surface C' of the concave portion C, so that the thin film is formed as known in the related art. Incidentally, although deposition surface B' of one side may not directly face the target material 4, since the target particles diffusely reflect in the deposition chamber 11, the thin film is also formed on the deposition surface B'.

When the deposition operation is finished, the deposition element is stopped and the front door is opened. The deposited workpiece W is removed by a handling device such as the robot described above. When the assisting members 1 and 2 affect the product adversely, the assisting members protruding outside the deposited workpiece W are cut off. The deposition for the subsequent workpiece for deposition is performed in the same way as described below.

MODIFICATIONS

Figure 3A:
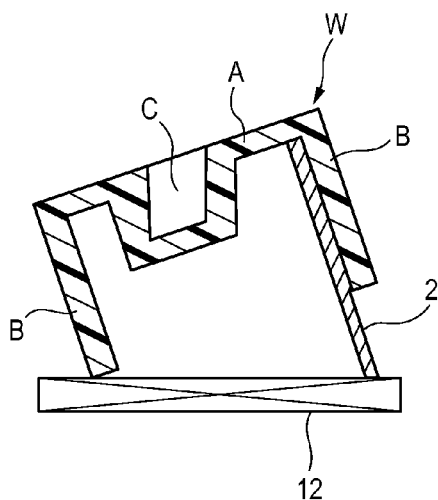

According to the above-described embodiment, the assisting members 1 and 2 are formed on both side portions B and B respectively. Alternatively, one assisting member may be formed. The example is illustrated in FIG. 3A. Although detailed description is not given, according to this modified embodiment, one side portion B is directly placed on the deposition stand 12, and only the other one is held by the assisting member 2.

Figure 3B:
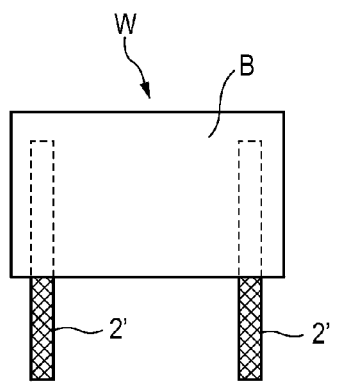

Further, a plurality of assisting member 1 or 2 may be provided. For example, FIG. 3B is a cross-sectional view corresponding to a view seen from an X-X direction in FIG. 1D. As shown in the side view, the assisting member 2 may be provided with two assist rods 2' and 2'. When one side of the workpiece W is supported by two assist rods 2' and 2', since the workpiece W is physically stable, the assisting member 1 may be provided with one rod. As described above, when the rod-shaped assisting member is provided, the amount of the resin, which is destroyed, decreases and the cost of the product reduces.

Further, in the above-described embodiment, the assisting members are integrally molded with the side portions B and B. However, the assisting members may be molded at other positions according to a shape of the workpiece for deposition W. Furthermore, when the auxiliary member such as a reinforcement member is molded with the back surface of the deposition surface of the workpiece for deposition W, the assisting member is molded with the auxiliary member. In this case, the workpiece for deposition W, the auxiliary member and the assisting member are integrally molded.

Still further, the portion, where the assisting member is cut off, may be molded with a structure that is easy to cut, for example, a structure that has a narrow cross section thereof. For example, when a plurality of assisting members is integrally molded with the workpiece for deposition W, at least one of the plurality of assisting members 1 and 2 is molded with a structure having a narrow cross section at a portion to be protruded outside the side portion B of the workpiece for deposition W. Specifically, the assisting member 2, which is longer than other assisting member 1 as shown in FIG. 2, may be molded with the structure having a narrow cross section at the portion to be protruded outside the side portion B' of the workpiece for deposition W. Alternatively, each the plurality of assisting members 1 and 2 may be molded with the structure having a narrow cross section at the portion to be protruded outside the side portion B of the workpiece for deposition W (see FIG. 1D, for example). By forming the narrow cross section to the assisting member, in addition to obtain the structure that is easy to cut, it is possible to reduce an amount of material for molding the assisting member.

Incidentally, the portion which is deposited by the embodiment is described as "the planar surface", however, it is clear that the deposition can be achieved to "a curved surface" such as a concave portion and a convex portion.

What is claimed is:

1. A method of deposition comprising:
   integrally molding a workpiece for deposition with an assisting member, which is configured to maintain the workpiece for deposition in a predetermined orientation such that a deposition surface or a deposition portion of the workpiece faces a target material when the workpiece for deposition is carried into a deposition chamber and is placed on a deposition stand, when the workpiece for deposition is molded by an injection molding using an injection mold;
   ejecting the workpiece including the assisting member from the injection mold;
   after the ejecting from the injection mold, carrying the workpiece for deposition, to which the assisting member is molded, into the deposition chamber;
   depositing the workpiece for deposition, to which the assisting member is molded; and
   cutting off the assisting member from the workpiece for deposition after the depositing,
   wherein the deposition chamber includes a planar deposition stand which is separate and distinct from the injection mold, and
   after the carrying of the workpiece into the deposition chamber, placing the workpiece on the planar deposition stand so as to be supported by the assisting member in an inclined position with respect to the planar deposition stand, so that a deposition surface of the workpiece has a predetermined angle with respect to a horizontal surface of the planar deposition stand.

2. The method of deposition according to claim 1, wherein the assisting member is directly molded with a back surface side of the workpiece for deposition or integrally molded with an auxiliary member of the workpiece for deposition.

3. The method of deposition according to claim 2, wherein the assisting member is integrally molded with the workpiece for deposition or the auxiliary member with having a portion where the cross section of the assisting member is narrow.

4. The method of deposition according to claim 1, wherein the assisting member is molded with the workpiece for deposition as a plurality of rod-shaped members.

5. The method of deposition according to claim 1, wherein the assisting member is molded to have a narrow cross section at the portion to be protruded outside a side portion of the workpiece for deposition.

6. The method of deposition according to claim 1, wherein a plurality of assisting members is integrally molded with the workpiece for deposition.

7. The method of deposition according to claim 6, wherein the plurality of assisting members is molded to have a narrow cross section at the portion to be protruded outside a side portion of the workpiece for deposition.

8. The method of deposition according to claim 6, wherein the plurality of assisting members is a pair of assisting members, wherein a first one of the plurality of assisting members has a shorter length than a second one of the plurality of assisting members.

9. The method of deposition according to claim 1, wherein the deposition chamber includes therein a planar deposition stand, and
   wherein after the carrying of the workpiece into the deposition chamber, placing the workpiece on the planar deposition stand so as to be supported by the assisting member, such that the depositing the workpiece is carried out while the workpiece is held at a predetermined position by the support by the assisting member.

10. The method of deposition according to claim 1, wherein the deposition chamber includes a planar deposition stand and a target mounting stand, and
   after the carrying of the workpiece into the deposition chamber, placing the workpiece in a position on the planar deposition stand so that the workpiece is inclined with respect to the target mounting stand, and a deposition surface of the workpiece has a predetermined angle with respect to a horizontal surface of the target mounting stand.

* * * * *